(12) United States Patent
Yang et al.

(10) Patent No.: US 8,920,888 B2
(45) Date of Patent: Dec. 30, 2014

(54) PLASMA PROCESS, FILM DEPOSITION METHOD AND SYSTEM USING ROTARY CHUCK

(75) Inventors: Yu-Lung Yang, Taichung (TW); Ying Xiao, Zhubei (TW); Chin-Hsiang Lin, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 174 days.

(21) Appl. No.: 13/439,609

(22) Filed: Apr. 4, 2012

(65) Prior Publication Data

US 2013/0264308 A1 Oct. 10, 2013

(51) Int. Cl.
*H05H 1/24* (2006.01)
*C23C 16/00* (2006.01)
*C23C 16/52* (2006.01)

(52) U.S. Cl.
USPC ............................. 427/569; 427/248.1; 427/8

(58) Field of Classification Search
CPC .... C23C 14/54; C23C 14/545; C23C 14/543; C23C 16/45551; C23C 16/45536; C23C 16/52; C23C 16/45523; C23C 16/4584; C23C 16/46; C23C 16/50
USPC .......................................... 427/8, 248.1, 569
See application file for complete search history.

(56) References Cited

U.S. PATENT DOCUMENTS

| 6,170,428 | B1 * | 1/2001 | Redeker et al. ............. 118/723 I |
| 6,524,449 | B1 * | 2/2003 | Folta et al. ............... 204/192.13 |
| 7,625,472 | B2 * | 12/2009 | Wickramanayaka .... 204/298.27 |
| 7,967,930 | B2 * | 6/2011 | Lewington et al. ............. 156/51 |
| 2010/0000855 | A1 | 1/2010 | Nakamura et al. |
| 2011/0236598 | A1 * | 9/2011 | Kumagai et al. .............. 427/569 |

FOREIGN PATENT DOCUMENTS

| JP | 2010027713 | 2/2010 |
| KR | 10-2008-0059304 | 6/2008 |
| KR | 10-0872908 | 12/2008 |

OTHER PUBLICATIONS

Office Action dated Aug. 16, 2013 with English translation from corresponding application No. KR 10-2012-0088973.
Notice of Allowance dated Feb. 7, 2014 with English translation from corresponding application No. KR 10-2012-0088973.

* cited by examiner

*Primary Examiner* — Kelly M Gambetta
(74) *Attorney, Agent, or Firm* — Lowe Hauptman & Ham, LLP

(57) ABSTRACT

A chuck and a wafer supported thereon are rotated during a plasma process or a film deposition process to reduce thickness non-uniformity of a film processed or deposited on the wafer.

20 Claims, 8 Drawing Sheets

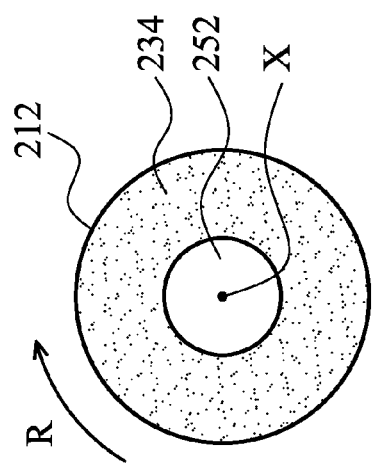
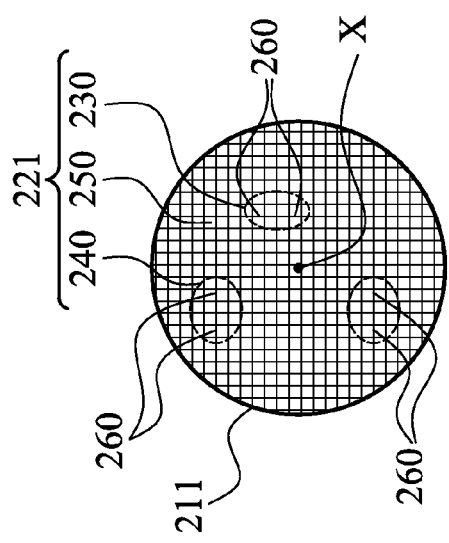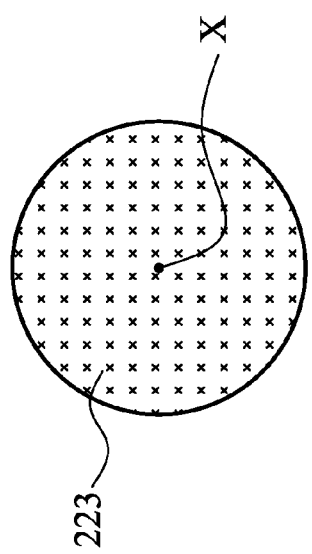
Fig. 2A  Fig. 2B  Fig. 2C  Fig. 2D

PLASMA PROCESS, FILM DEPOSITION METHOD AND SYSTEM USING ROTARY CHUCK

BACKGROUND

A recent tendency in the field of semiconductor manufacturing is to reduce production cost by using larger wafers. The migration to a larger wafer size, while rewarding in an increased number of chips per wafer, also poses numerous technical challenges, such as maintenance of a uniform processing environment across a large wafer.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

FIGS. 2A-2D are schematic top views of films deposited on wafers during various stages of a film deposition process in accordance with some embodiments.

DETAILED DESCRIPTION

Figure 1A:
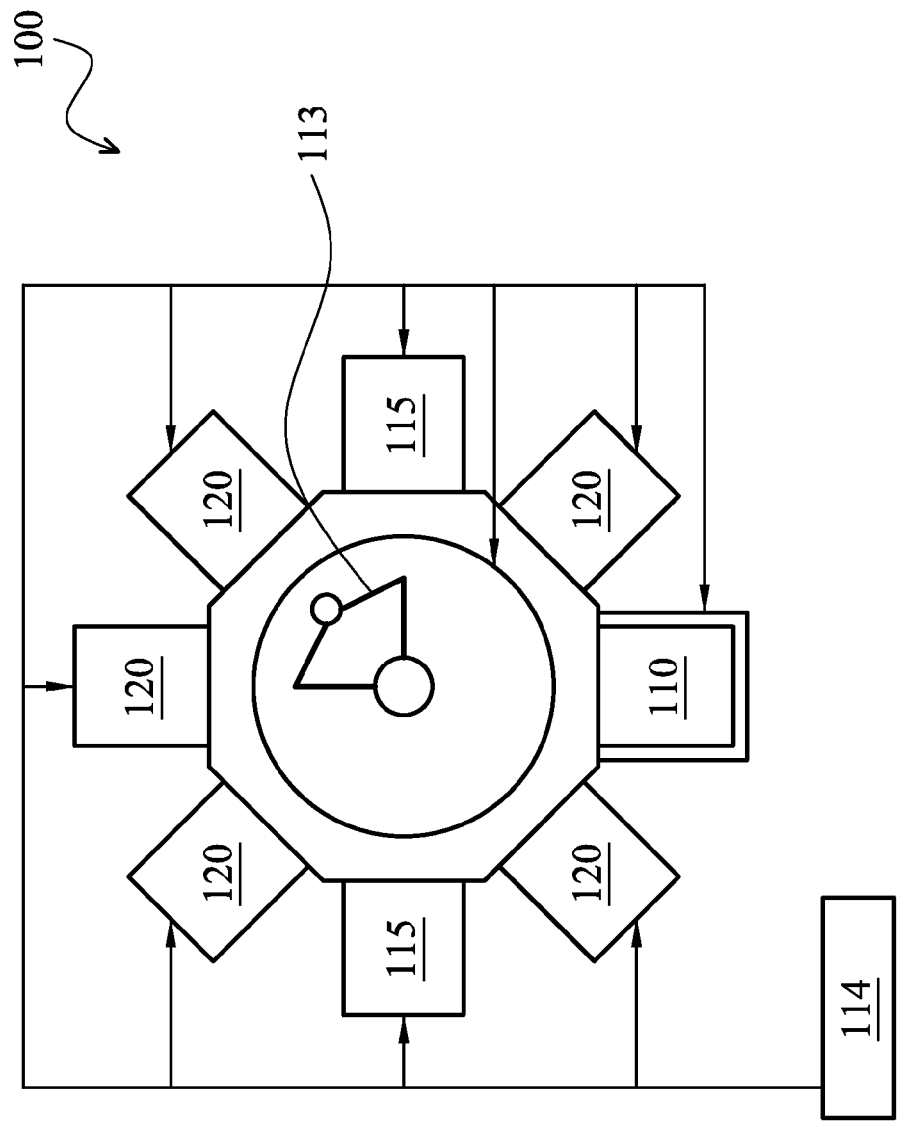
FIG. 1A is a schematic view of a wafer processing system in accordance with some embodiments.

It is to be understood that the following disclosure provides many different embodiments or examples, for implementing different features of various embodiments. Specific examples of components and arrangements are described below to simplify the present disclosure. An inventive concept may, however, be embodied in many different forms and should not be construed as being limited to the embodiments set forth herein; rather, these embodiments are provided so that this description will be thorough and complete, and will fully convey an inventive concept to those of ordinary skill in the art. It will be apparent, however, that one or more embodiments may be practiced without these specific details.

In the drawings, the thickness and width of layers and regions are exaggerated for clarity. Like reference numerals in the drawings denote like elements. The elements and regions illustrated in the figures are schematic in nature, and thus relative sizes or intervals illustrated in the figures are not intended to limit the scope of an inventive concept.

Some embodiments provide a method and system in which a plasma process is performed on a wafer while the wafer is rotated to reduce thickness non-uniformity of a film on the wafer which film is processed by the plasma process. Some embodiments also provide a method and system in which a film deposition process, other than spin-coating or similar techniques, is performed on a wafer while the wafer is rotated to reduce thickness non-uniformity of a film deposited on the wafer by the film deposition process.

FIG. 1A is a schematic view of a wafer processing system 100 in accordance with some embodiments. The wafer processing system 100 in FIG. 1 includes a load lock chamber 110, a robot 113, a controller 114, one or more metrology chambers 115, and a plurality of process chambers 120. The load lock chamber 110 transfers wafers into and out of the wafer processing system 100, e.g., under a vacuum environment. The robot 113 transfers the wafer among the load lock chamber 110, the process chambers 120, and the metrology chambers 115. The process chambers 120 are equipped to perform one or more of numerous processes or treatments, such as Chemical Vapor Deposition (CVD), Atomic Layer Deposition (ALD), Physical Vapor Deposition (PVD), annealing, etching, degassing, pre-cleaning, cleaning, post-cleaning, etc. The metrology chambers 115 are configured to measure various properties of wafers before or after processing. In some embodiments, one or more metrology chambers 115 is/are integrated in one or more of the process chambers 120. The controller 114 is configured to control wafer measurement, transfer and processing. In one or more embodiments, the controller 114 comprises a hardware platform, such as a processor or controller chip coupled with a memory, which is programmable by software and/or firmware to perform the functions described herein. In some embodiments, the controller 114 comprises a dedicated hardware circuit, e.g., in the form of an application-specific integrated circuit (ASIC) hardwired to perform one or more of the processes described herein. While five process chambers 120 and two metrology chambers 115 are shown, other numbers of process chambers 120 and/or metrology chambers 115 are within the scope of this disclosure. Likewise, in some embodiments, more than one robot 113 and/or load lock chamber 110 are included in the processing system 100.

Figure 1B:
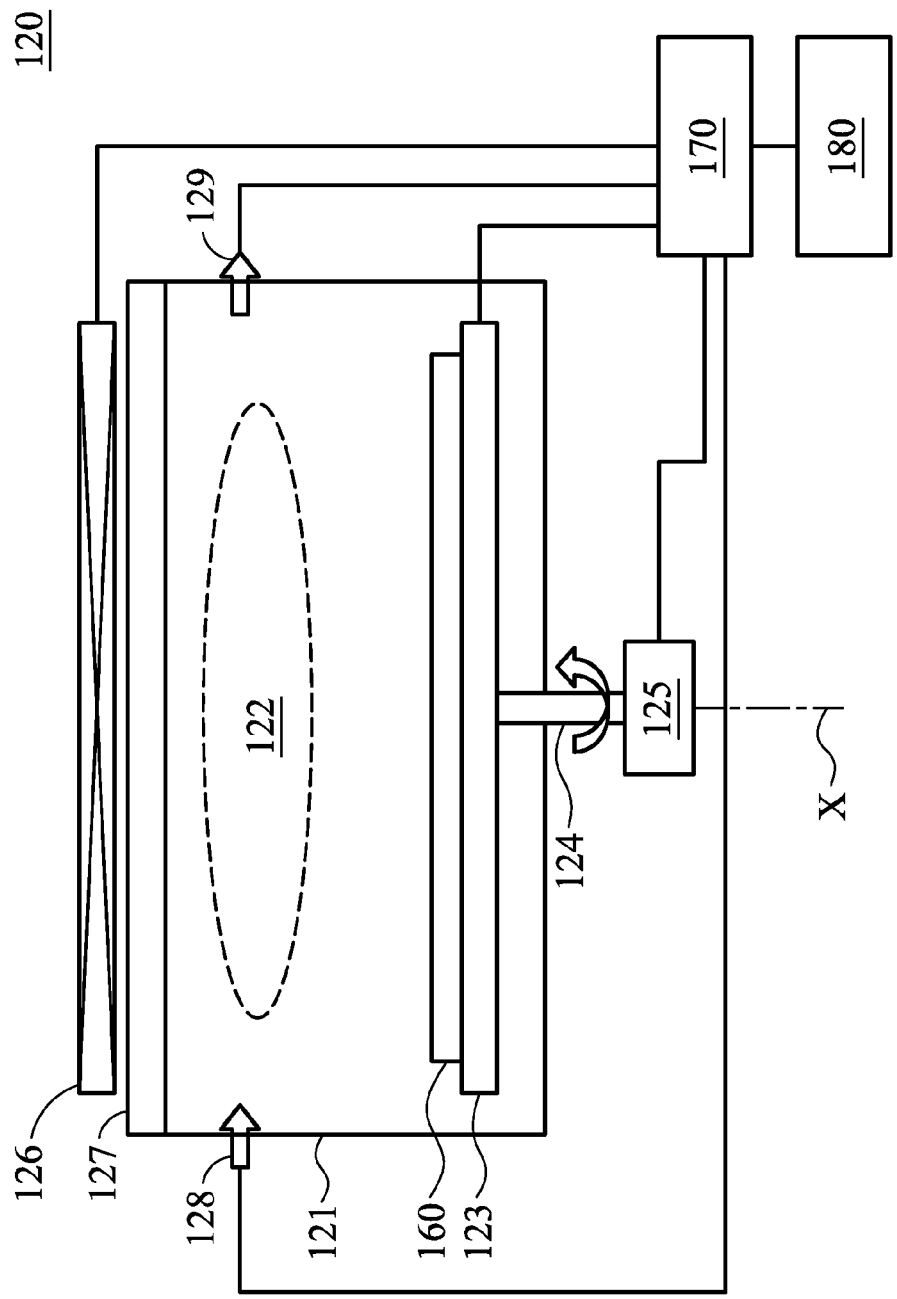
FIG. 1B is a schematic cross-section view of a process chamber accordance with some embodiments.

FIG. 1B is a schematic cross-section view of a process chamber 120 in accordance with some embodiments. In the embodiment specifically disclosed in FIG. 1B, the process chamber 120 is a plasma process chamber configured to generate a plasma during and for assisting wafer processing in the process chamber 120.

The process chamber 120 includes a housing 121 in which a plasma 122 is to be generated. A chuck 123 is disposed in the housing 121 facing the region where the plasma 122 is to be generated, and is configured to support thereon a wafer 160 to be processed. The process chamber 120 further includes a plasma power source, e.g., one or more spiral coils 126, on top of the housing 121. The one or more spiral coils 126 are separated from the housing 121 by a dielectric material 127. One or more gas inlets 128 are provided through the housing 121 for supplying working and/or cleaning gas into the process chamber 120, and one or more gas outlets 129 are provided through the housing 121 for exhausting worked and/or contaminated gas from the process chamber 120. In some embodiments, a vacuum system is connected to one or more of the gas outlets 129 for maintaining an intended operating pressure in the process chamber 120. A controller 170 is provided individually to the process chamber 120 to control the chuck 123, the spiral coils 126, the gas inlets 128, and the gas outlets 129. In some embodiments, the controller 170 is incorporated, partly or wholly, in the controller 114 of the wafer processing system 100. The controller 170 is configured to control, during operation, chuck rotation, gas flow rate, pressure, temperature, plasma power and frequency, etc. Data for use during the controlling operation of the controller 170 is stored in a data storage 180. The data is also updated by the controller 170. In some embodiments, the data storage 180 is incorporated, partly or wholly, in the controller 170.

In some embodiments, the chuck 123 is an electrostatic chuck (ESC) that uses the attraction of opposite charges on the chuck and on the wafer 160 supported by the chuck 123 to hold or secure the wafer 160 on the chuck 123. In some embodiments, the chuck 123 is a vacuum chuck that generates vacuum pressures through a number of vacuum ports in the chuck 123 to hold the wafer 160 on the chuck 123. In some embodiments, the chuck 123 is a mechanical chuck that uses mechanical clamps to secure the wafer 160 thereon. Other wafer holding arrangements are usable in further embodiments.

In some embodiments, the chuck 123 includes one or more heaters (e.g., resistive heating elements) for heating the wafer 160 during wafer processing. In one or more embodiments, a heat transfer gas, e.g., helium, is supplied between the chuck 123 and the wafer 160 to improve thermal transfer therebetween. The controller 170 is connected to the heaters of the chuck 123 and/or to a source of the heat transfer gas for wafer temperature control.

The chuck 123 is a rotary or rotatable chuck that is supported on a shaft 124 for rotational movement about a rotational axis X. The shaft 124 is driven by a chuck rotating mechanism 125, e.g., a motor. In some embodiments, rotary chuck configurations generally used for spin-coating are adopted in the chuck 123. Other rotary chuck arrangements are usable in further embodiments. The controller 170 is connected to the motor 125 for controlling rotational movement of the chuck 123 and the wafer 160 held thereon about the rotational axis X.

In some embodiments, the process chamber 120 is configurable to perform one or more plasma processes. Examples of plasma processes include, but are not limited to, plasma enhanced film deposition, plasma etch and plasma photoresist strip (PR strip). For example, a plasma enhanced film deposition process, the wafer 160 is secured on the chuck 123, the spiral coils 126 are energized to generate the plasma 122, and one or more working gas is flown into/through the process chamber 120 via the gas inlets 128 and/or gas outlets 129. In some embodiments, the plasma enhanced film deposition process is plasma enhanced chemical vapor deposition (PECVD) in which plasma excitation caused by the plasma 122 enhances the CVD process in various manners, such as, at a lower temperature and/or with chemical reaction activation, etc. In some embodiments, the plasma enhanced film deposition process is plasma enhanced atomic layer deposition (PEALD) in which two or more working gases are introduced into the process chamber 120, and the plasma 122 is utilized to activate at least one of the working gases.

In some embodiments, the process chamber 120 is configurable to deposit films from gaseous or aerosol precursors on wafers by performing film deposition processes that do not utilize plasma, e.g., thermal film deposition including, but not limited to, thermally excited CVD and ALD. As used herein, "film deposition process" excludes spin coating and techniques that use centrifugal force to spread a liquid or solution on a substrate.

The following description will describe some embodiments that use a film deposition process. The same description or a similar description is applicable to other plasma processes, such as plasma etch, PR strip etc.

Thickness uniformity of a deposited film across the wafer is a consideration in semiconductor device manufacture. The requirement has increasingly become more and more stringent as the technology advances and the industry attempts to reduce production cost by using larger wafers, such as 450 mm wafers. Because wafers become larger, it is more difficult to obtain a uniform film thickness across the wafer. Local defects or thickness non-uniformity is/are likely to occur due to various factors, e.g., the non-symmetricity of the geometry and size of the process chamber 120, the arrangement and/or configuration of the spiral coils 126 which affect plasma uniformity, the distribution of working gas in the process chamber 120, etc.

FIG. 2A is a schematic top view of a first wafer 211 on which a first film 221 is deposited by a film deposition process in the process chamber 120. The first wafer 211 is stationary during the film deposition process. Due to one or more of various factors described above, the first film 221 has thickness non-uniformity in regions 230, 240 which are referred to herein as non-uniform regions 230, 240. A remaining region 250 of the first film 221 outside the regions 230, 240 exhibits thickness uniformity and is referred to herein as the uniform region 250.

In some embodiments, to determine any thickness non-uniformity the first film 221 might have, a plurality of thickness measurements are performed on the first film 221 at a number of measuring points 260 which are arranged at intersections of a regular grid. In one or more embodiments, the measuring points 260 are not necessarily arranged at intersections of a regular grid, e.g., more concentrated towards the center or more concentrated toward the edge of the first wafer 211 depending on particular applications. The thickness measurements are taken, in some embodiments, by a microscope and/or in one of the metrology chambers 115.

The uniform region 250 is determined to have thickness uniformity when the measured thickness values at the measuring points 260 inside the uniform region 250 are within a predetermined thickness window, e.g., within a predetermined range of thickness around a target thickness or a critical dimension (CD) of the first film 221. The CD and/or thickness window is/are dictated by various design rules.

The non-uniform regions 230, 240 are determined to have thickness non-uniformity when the measured thickness values at the measuring points 260 inside the non-uniform regions 230, 240 are outside the predetermined thickness window, e.g., outside the predetermined range of thickness around the target thickness or the CD of the first film 221. Assuming that the measured thickness values at the measuring points 260 inside the non-uniform region 230 are higher than the predetermined thickness window, the non-uniform region 230 is referred to as a high thickness region 230. Assuming that the measured thickness values at the measuring points 260 inside the non-uniform region 240 are below the predetermined thickness window, the non-uniform region 240 is referred to as a low thickness region 240. A film (such as the first film 221) is considered to exhibit thickness non-uniformity when one or more high thickness region (such as the region 230) and/or low thickness region (such as the region 240) exist.

The high thickness region 230 and low thickness region 240 are often caused by non-symmetricity of various components and/or operating conditions of the process chamber 120 and the film deposition process performed therein. As shown in FIG. 2A, each of the high thickness region 230 and low thickness region 240 is non-symmetric with respect to the rotational axis X of the chuck 123 (FIG. 1B). A film (such as the first film 221) is considered to exhibit asymmetric or non-symmetric thickness non-uniformity when one or more high thickness region (such as the region 230) and/or low thickness region (such as the region 240) exist and at least one of the high and/or low thickness region(s) is non-symmetric with respect to the rotational axis X of the chuck 123 which supports the wafer while the film is deposited thereon.

In some embodiments, asymmetric thickness non-uniformity is compensated for by performing the film deposition process while rotating the chuck 123 and a wafer supported thereon. The rotational movement of the wafer, while the film deposition process is being performed, evens out non-uniformity of the film deposition conditions, i.e., plasma, chamber configuration, working gas distribution, etc. at least in the rotational direction of the chuck 123. As a result, asymmetric thickness non-uniformity is reduced or even eliminated.

FIG. 2B is a schematic top view of a second wafer 212 on which a second film 222 is deposited, in some embodiments, by the film deposition process that was used to form the first film 221 on the first wafer 211 in the process chamber 120. The second film 222 is formed by performing the film deposition process while rotating the chuck 123 on which the second wafer 212 is held. If the second film 222 had been formed under the same conditions as the first film 221, i.e., with the second wafer 212 held stationary, asymmetric thickness non-uniformity, such as high thickness region 230 and low thickness region 240, would have occurred in the second film 222. However, by rotating the second wafer 212 while depositing the second film 222, the asymmetric thickness non-uniformity is spread out in the rotational direction R of the chuck 123. The deposited material, which would have formed the high thickness region 230 and low thickness region 240 had the chuck 123 been held stationary, are merged together and form a region 234. The second film 222 has another region 252 outside the region 234. Due to the rotational movement of the chuck 123 and the second wafer 212 held thereon, both regions 234 and 252 are symmetric with respect to the rotational axis X of the chuck 123. Other than two symmetric regions are formed in one or more embodiments.

In some embodiments, symmetric regions 234 and 252 exhibit thickness uniformity, i.e., the thicknesses of the second film 222 at various measuring points 260 inside each of the symmetric regions 234 and 252 are within the predetermined thickness window. The thickness of the second film 222 in one region, e.g., the region 234, may still be different from the thickness of the second film 222 in another region, e.g., the region 252. However, since the thickness in both regions 234 and 252 are within the predetermined thickness window, the second film 222 is considered to exhibit thickness uniformity which is advantageous in many aspects.

In some embodiments, one or more of the symmetric regions 234 and 252, e.g., the region 234, still exhibit thickness non-uniformity. Specifically, the thicknesses of the second film 222 at various measuring points 260 inside the symmetric region 234, although roughly equal to each other due to the rotational movement of the second wafer 212 while the second film 222 is being deposited, are still outside the predetermined thickness window. The second film 222 in this situation is considered to exhibit symmetric thickness non-uniformity. Further varying parameters of the rotational movement of the chuck 123 is unlikely to be effective in removing or reducing such symmetric thickness non-uniformity.

In some embodiments, symmetric thickness non-uniformity (e.g., the region 234) is compensated for by one or more symmetric tuning knobs equipped in the process chamber 120. A tuning knob is a tool that permits one or more film deposition conditions/parameters to be controllably varied. The tool in some embodiments is automatic and/or manual. A tuning knob is considered symmetric if the knob provides various controllable zones, in which the corresponding conditions/parameters are controllably variable and which are symmetric with respect to the rotational axis X of the chuck 123.

Figure 3B:
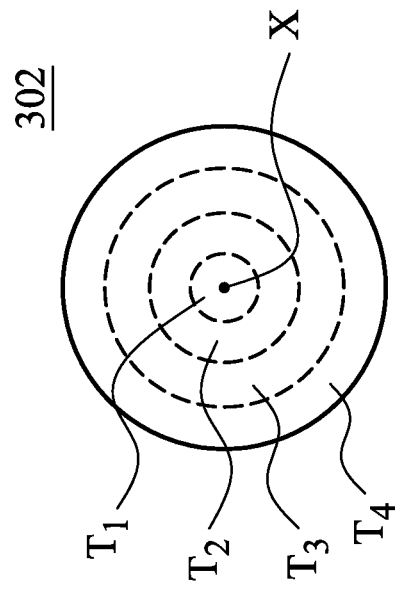
FIGS. 3A and 3B are schematic top views of controllable zones of various symmetric tuning knobs in accordance with some embodiments.
Figure 3A:
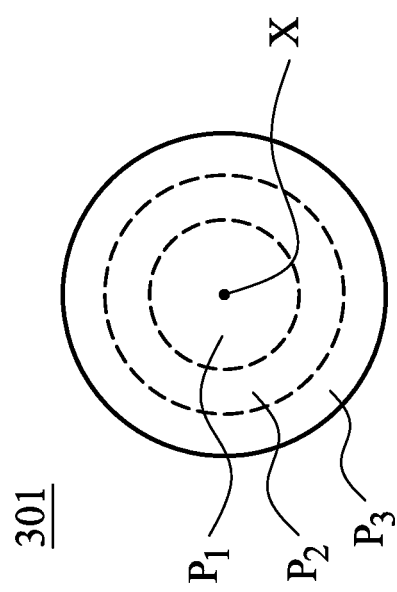

FIG. 3A is a schematic top view of controllable zones P1, P2, P3 of a first symmetric tuning knob 301 in accordance with some embodiments. The controllable zones P1, P2, P3 are symmetric with respect to the rotational axis X of the chuck 123. The first symmetric tuning knob 301 is a symmetric plasma power tuning knob which permits the plasma power to be adjusted independently in each of the controllable zones P1, P2, P3. Other than three plasma power controllable zones are provided in one or more embodiments. The symmetric plasma power tuning knob 301 is implemented in some embodiments by arranging multiple spiral coils 126, one concentrically inside the other in the regions corresponding to the controllable zones P1, P2, P3. Each of the spiral coils 126 are independently controllable with respect to the other coils, to receive different/controllable powers, voltages, radio frequencies, etc. As a result, the plasma power in each of the controllable zones P1, P2, P3 is variable, i.e., tunable, independently from the other zones.

FIG. 3B is a schematic top view of controllable zones T1, T2, T3, T4 of a second symmetric tuning knob 302 in accordance with some embodiments. The controllable zones T1, T2, T3, T4 are symmetric with respect to the rotational axis X of the chuck 123. The second symmetric tuning knob 302 is a symmetric substrate (or wafer) temperature tuning knob which permits the temperature of the wafer on which a film is being deposited to be adjusted independently in each of the controllable zones T1, T2, T3, T4. Other than four substrate temperature controllable zones are provided in one or more embodiments. The symmetric substrate temperature tuning knob 302 is implemented in some embodiments by independently controlling heaters embedded in the chuck 123 in regions corresponding to the controllable zones T1, T2, T3, T4. The heaters or groups of heaters are independently controllable with respect to each other, to receive different/controllable heating voltages/currents. As a result, the substrate temperature in each of the controllable zones T1, T2, T3, T4 is variable, i.e., tunable, independently from the other zones.

Other symmetric tuning knobs are usable in some embodiments. For example, a gas flow control tuning knob is used in one or more embodiments to adjust gas flow rates of the working gas(es) used during the film deposition process in different regions over the wafer. In one or more embodiments, the process chamber 120 is equipped with more than one symmetric tuning knobs.

FIG. 2C is a schematic top view of a third wafer 213 on which a third film 223 is to be deposited, in some embodiments, by the film deposition process that was used to deposit the first film 221 on the first wafer 211 and to deposit the second film 222 on the second wafer 212 in the process chamber 120. The third film 223 is formed by performing the film deposition process while rotating the chuck 123 on which the third wafer 213 is held. If the third film 223 had been formed under the same conditions as the second film 222, i.e., with no additional symmetric tuning knob implemented, symmetric thickness non-uniformity (e.g., the region 234) would have occurred in the third film 223. However, by using one or more symmetric tuning knobs, while depositing the third film 223 and rotating the chuck 123, the symmetric thickness non-uniformity (e.g., the region 234) is compensated for or eliminated in some embodiments.

In the embodiment specifically illustrated in FIG. 2C, the plasma power tuning knob 301 (FIG. 3A) is used. Given that the symmetric thickness non-uniformity region 234 has thickness values greater than the predetermined thickness window, and is located corresponding to the controllable zones P2 and P3 of the plasma power tuning knob 301. To avoid (or at least minimize a likelihood of) such a high thickness region from occurring in the third wafer 213, the plasma power in the controllable zones P2 and P3 is adjusted, e.g., reduced, during the film deposition process and rotational movement of the third wafer 213. (If the symmetric thickness non-uniformity region 234 has thickness values lower than the predetermined thickness window, the plasma power in the controllable zones P2 and P3 is increased during the film deposition process and rotational movement of the third wafer 213.) As a result, the thickness of the third film 223 formed in the regions corresponding to the controllable zones P2 and P3 becomes less than that of the symmetric thickness non-uniformity region 234 in the second film 222, and falls within the predetermined thickness window. The plasma power in the controllable zone P1 corresponding to the region 252, which already exhibits thickness uniformity, is unchanged relative to the film deposition process of the second film 222. As a result, the thickness of the third film 223 formed in the region corresponding to the controllable zone P1 is about the same as the thickness of the region 252 of the second film 222. The resulting third film 223, which exhibits thickness uniformity over its entire area, is illustrated in FIG. 2D.

In some embodiments, if the use of one symmetric tuning knob is insufficient to obtain a deposited film with thickness uniformity, more than one symmetric tuning knobs are used. For example, as shown in FIG. 2C, the innermost portion 291 of the symmetric thickness non-uniformity region 234 is located within the controllable zone P1 with plasma power unchanged relative to the film deposition process of the second film 222. Thus, the region of the third film 223 corresponding to the innermost portion 291 of the symmetric thickness non-uniformity region 234 of the second film 222 might still exhibit symmetric thickness non-uniformity if only the plasma power tuning knob 301 is used during the film deposition process of the third film 223. By additionally using another symmetric tuning knob, such as the symmetric substrate temperature tuning knob 302 (FIG. 3B) such a likelihood is avoidable.

Specifically, the plasma power tuning knob 301 provides three controllable zones P1, P2, P3 whereas the symmetric substrate temperature tuning knob 302 provides four controllable zones T1, T2, T3, T4. Together, both the plasma power tuning knob 301 and the symmetric substrate temperature tuning knob 302 provide twelve controllable zones which, in turn, offer significant flexibility in controlling the thickness uniformity from the center (i.e., rotational axis X of the chuck 123) to the edge of the wafer. In the situation illustrated in FIG. 2C, the potential symmetric thickness non-uniformity in the region 291 is compensated for by adjusting the substrate temperature in the corresponding controllable zone, e.g., T2, of the symmetric substrate temperature tuning knob 302. For example, if the thickness in the region 291 is expected to be higher than the predetermined thickness window, the substrate temperature in the corresponding controllable zone T2 is reduced, and vice versa. In some embodiments, the adjustment of the substrate temperature in the controllable zone T2 is performed without significantly changing the thickness of the deposited film outside the region 291 to be beyond the predetermined thickness window. In some embodiments, more than two symmetric tuning knobs are used during a film deposition process on a rotated wafer.

Thus, in some embodiments, by rotating a chuck and a wafer held thereon during a film deposition process or a plasma process to deposit or process a film on the wafer, asymmetric thickness non-uniformity of the film is compensated for, resulting in the deposited or processed film having thickness uniformity or at least no asymmetric thickness non-uniformity. Any persistent thickness non-uniformity is changed, by the rotational movement of the wafer, to symmetric thickness non-uniformity and is further compensated for by one or more symmetric tuning knobs. The number of tuning knobs used for obtaining thickness uniformity is significantly reduced when the chuck is rotated during the film deposition process or plasma process compared to when the chuck is not rotated. For example, in some situations where ten or more tuning knobs are required to remove asymmetric thickness non-uniformity of a film deposited or plasma processed on a stationary wafer, two symmetric tuning knobs may be sufficient if the wafer is rotated during the film deposition or plasma process. As a result, the cost and complexity of the manufacturing process are reduced while film quality is improved and/or ensured.

Figure 4:
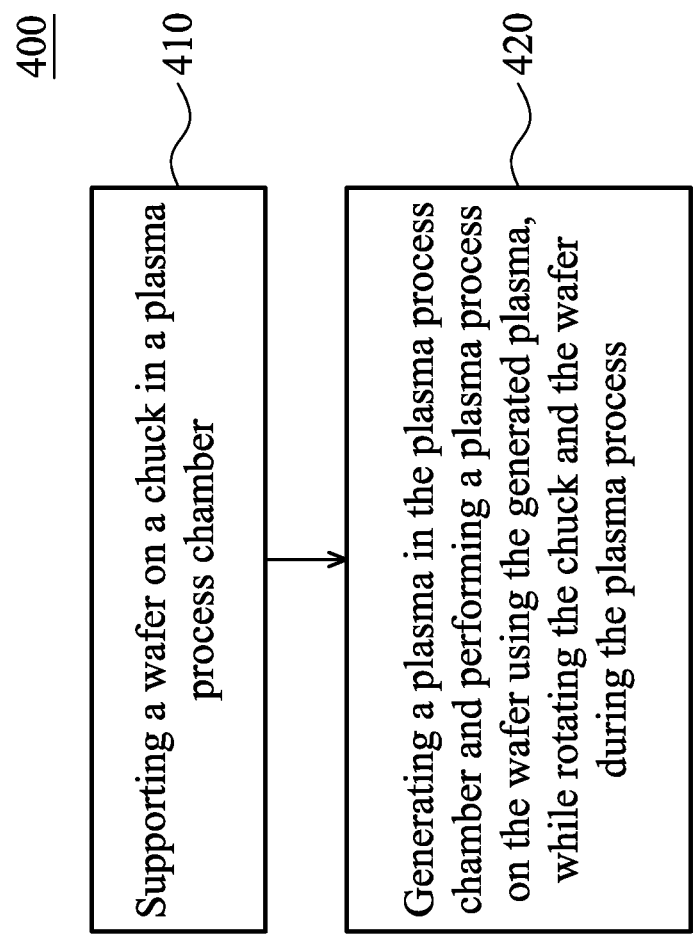
FIGS. 4-6 are flow charts of various methods in accordance with some embodiments.

FIG. 4 is a flow chart of a film deposition method 400 in accordance with some embodiments. In one or more embodiments, the film deposition method 400 is performed by the wafer processing system 100 as described with respect to FIG. 1A and/or the process chamber 120 as described with respect to FIG. 1B.

At operation 410, a wafer is supported on a chuck in a plasma process chamber. For example, a wafer 212 is supported on the chuck 123 in the process chamber 120 which is a plasma process chamber.

At operation 420, a plasma is generated in the plasma process chamber and a plasma process is performed on the wafer using the generated plasma, while the chuck and the wafer supported thereon are rotated during the plasma process. For example, the plasma 122 is generated in the plasma process chamber 120 for use in a plasma process (e.g., PECVD, PEALD, plasma etch, or PR strip) during which the chuck 123 and the wafer 212 held thereon are rotated about the rotational axis X of the chuck 123. As a result, thickness non-uniformity, especially asymmetric thickness non-uniformity, of a film on the wafer, which film is processed by the plasma process, is changed to symmetric thickness non-uniformity or even eliminated as described with respect to FIG. 2B. In some embodiment, the symmetric thickness non-uniformity is further compensated for by one or more symmetric tuning knobs as described with respect to FIGS. 2C-2D.

Figure 5:
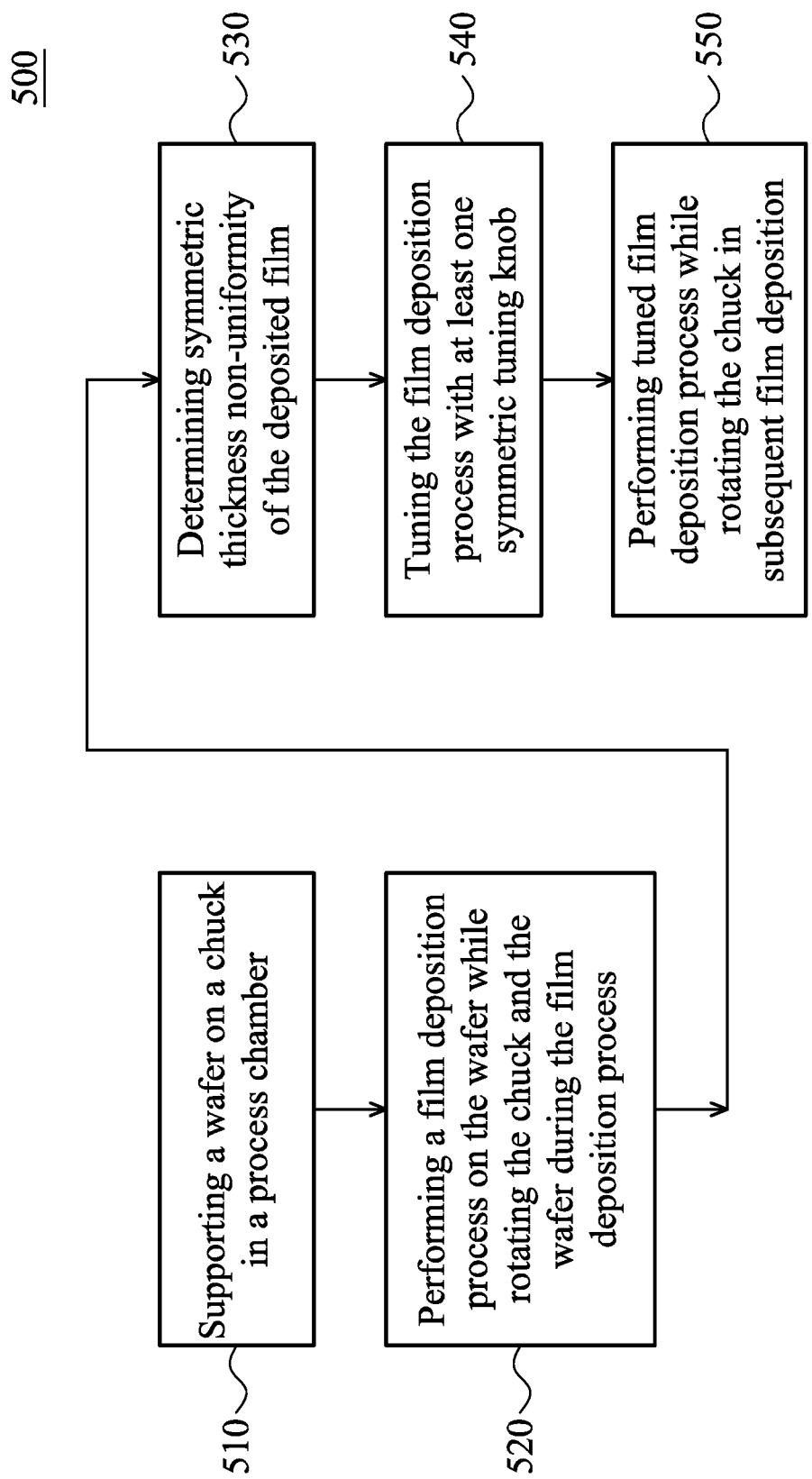

FIG. 5 is a flow chart of a film deposition method 500 in accordance with some embodiments. In one or more embodiments, the film deposition method 500 is performed by the wafer processing system 100 as described with respect to FIG. 1A and/or the process chamber 120 as described with respect to FIG. 1B.

At operation 510, a wafer is supported on a chuck in a process chamber. For example, a wafer 212 is supported on the chuck 123 in the process chamber 120 which is a plasma process chamber in one or more embodiments.

At operation 520, a plasma is generated in the plasma process chamber and a film deposition process is performed to deposit a film on the wafer using the generated plasma, while the chuck and the wafer supported thereon are rotated during the film deposition process. For example, the plasma 122 is generated in the plasma process chamber 120 for use in a film deposition process, e.g., PECVD or PEALD, during which the chuck 123 and the wafer 212 held thereon are rotated about the rotational axis X of the chuck 123. As a result, thickness non-uniformity, especially asymmetric thickness non-uniformity, of the deposited film is reduced as described with respect to FIG. 2B.

In some embodiments, at least one parameter of the rotational movement of the chuck 123, e.g., velocity, rotational direction (clockwise or counterclockwise), duration and timing (beginning and/or ending) of the rotational movement, etc., is determined based on asymmetric thickness non-uniformity of a film deposited on a previous wafer by the film deposition process. For example, as described with respect to FIGS. 2A-2B, the asymmetric thickness non-uniformity (e.g., high thickness region 230 and/or low thickness region 240) of a film 221 deposited on a previous wafer 211 by the film deposition process is determined, and an appropriate velocity of the chuck 123 is determined to sufficiently spread out the asymmetric thickness non-uniformity over the wafer to form a thickness uniformity, or at least symmetric thickness non-uniformity, region 234. The asymmetric thickness non-uniformity is measured as described with respect to FIG. 2A in one or more metrology chamber, such as the metrology chamber 115.

In some embodiments, the rotational parameter, e.g., velocity, of the chuck 123 is selected by the controller 170 from pre-stored data, e.g., a look-up table (LUT), in the storage device 180. The pre-stored data is collected from a number of previously deposited films and correlates each asymmetric thickness non-uniformity with a chuck's rotational velocity that had successfully compensated for the asymmetric thickness non-uniformity. When the pre-stored data includes asymmetric thickness non-uniformity matching that of the wafer 211, the chuck's rotational velocity that had successfully compensated for the pre-stored asymmetric thickness non-uniformity is selected by the controller 170 to control the chuck 123 during the film deposition process on the wafer 212. If no matching asymmetric thickness non-uniformity is found in the pre-stored data, the controller 170 calculates the chuck's velocity, e.g., by interpolation, based on the pre-stored data. The asymmetric thickness non-uniformity of the wafer 211 and the chuck's calculated velocity is stored in the data storage 180 for subsequent use on other wafers and/or wafer batches. In some embodiments, pre-stored data is replaced or used in conjunction with one or more formulas and/or computer simulations to determine the rotational parameter of the chuck 123.

At operation 530, symmetric thickness non-uniformity of the deposited film that has been formed by performing the film deposition process while rotating the chuck holding the wafer is determined. For example, as described with respect to FIG. 2B, the symmetric thickness non-uniformity of the deposited film 222 is determined, e.g., by thickness measurements in a metrology chamber 115.

At operation 540, the film deposition process is tuned with at least one symmetric tuning knob. For example, as described with respect to FIG. 2C, a symmetric tuning knob, such as the plasma power tuning knob 301, is performed to reduce or eliminate the determined symmetric thickness non-uniformity of the deposited film 222. The specific symmetric tuning knob to be tuned and/or the specific manner (e.g., the specific controllable zone(s), power, voltage, etc.) for tuning the symmetric tuning knob is determined, in some embodiments, by the controller 170 from pre-stored data, e.g., a LUT, in the storage device 180. The pre-stored data is collected from a number of previously deposited films and correlates each symmetric thickness non-uniformity with at least one particular symmetric tuning knob and its tuning that had successfully compensated for the symmetric thickness non-uniformity. When the pre-stored data includes symmetric thickness non-uniformity matching that of the wafer 221, the particular symmetric tuning knob and its tuning that had successfully compensated for the pre-stored symmetric thickness non-uniformity is selected by the controller 170 to tune the film deposition process. If no matching symmetric thickness non-uniformity is found in the pre-stored data, the controller 170 determines the symmetric tuning knob and its tuning by calculation and/or simulation and stores the calculated/simulated results in the data storage 180 for at least one subsequent wafer and/or wafer batch.

At operation 550, the tuned film deposition process is used to deposit a film on a subsequent wafer, e.g., the wafer 213, while the wafer 213 is rotated.

In some embodiments, one or more of operations 530-550 is/are omitted. For example, based on the measured asymmetric thickness non-uniformity of a previous wafer, e.g., the wafer 211, the controller 170 is configured to determine not only the rotational parameter for eliminating or reducing the measured asymmetric thickness non-uniformity, but also to predict any symmetric thickness non-uniformity potentially persisting if the chuck 123 is rotated with the determined rotational parameter. The controller 170 is further configured to determine the one or more symmetric tuning knob and its tuning that would eliminate or reduce the predicted, potential symmetric thickness non-uniformity. The controller 170 is also configured to apply, in operation 520, the determined rotational parameter of the chuck that would compensate for the measured asymmetric thickness non-uniformity of the film 221, as well as the determined symmetric tuning knob and its tuning that would compensate for the predicted, potential symmetric thickness non-uniformity. The resulting deposited film will exhibit thickness uniformity, as described with respect to FIGS. 2C-2D.

Figure 6:
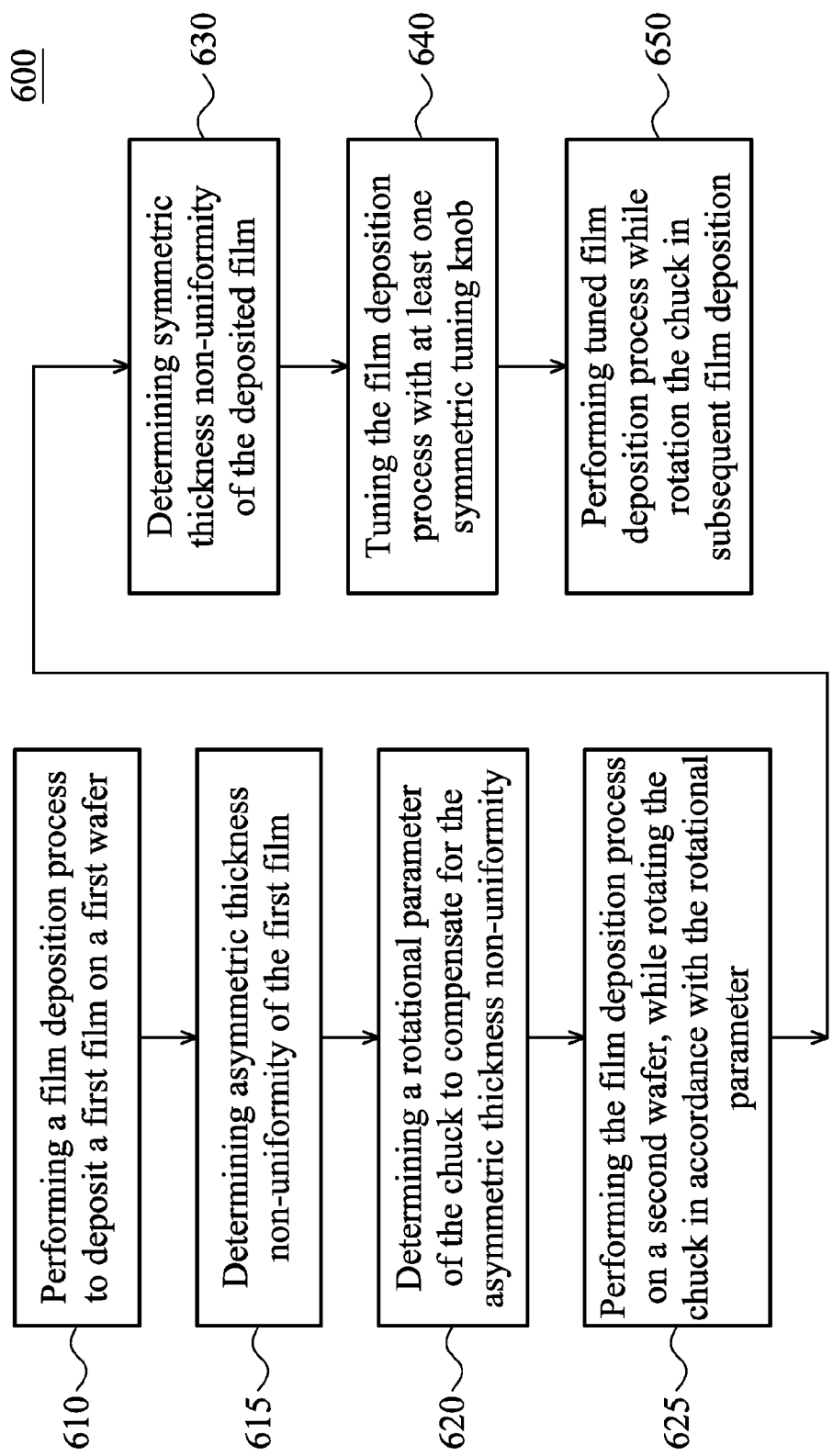

FIG. 6 is a flow chart of a film deposition method 600 in accordance with some embodiments. In one or more embodiments, the film deposition method 600 is performed by the wafer processing system 100 as described with respect to FIG. 1A and/or the process chamber 120 as described with respect to FIG. 1B.

At operation 610, a first wafer is supported on a chuck in a process chamber, and a film deposition process is performed on the first wafer to deposit a first film on the first wafer. For example, as described with respect to FIG. 2A, a first wafer 211 is supported on the chuck 123 in the process chamber 120, and a film deposition process is performed on the first wafer 211 to deposit a first film 221 on the first wafer 211. In one or more embodiments, the film deposition process is a thermal deposition or plasmas-enhanced deposition. In one or more embodiments, the first wafer 211 is kept stationary during the film deposition process. In one or more embodiments, the first wafer 211 is rotated, e.g., at an arbitrary velocity.

At operation 615, asymmetric thickness non-uniformity of the first film is determined. For example, as described with respect to FIG. 2A, asymmetric thickness non-uniformity (e.g., one or more high thickness region 230 and/or low thickness region 240) of the first film 221 is determined, e.g., in a metrology chamber 115.

At operation 620, a rotational parameter of the chuck is determined to compensate for the asymmetric thickness non-uniformity of the first film. For example, as described with respect to FIG. 2B, a rotational parameter of the chuck 123 is determined to at least change the asymmetric thickness non-uniformity (e.g., the regions 230 and/or 240) of the first film 221 to symmetric thickness non-uniformity (e.g., the region 234). The rotational parameter is determined, in one or more embodiments, by the controller 170 in the manner described with respect to FIG. 5.

At operation 625, a second wafer is supported on the chuck, and the film deposition process is performed on the second wafer, while rotating the chuck in accordance with the determined rotational parameter, to deposit a second film on the second wafer. For example, as described with respect to FIG. 2B, a second wafer 212 is supported on the chuck 123, and the film deposition process is performed on the second wafer 212, while rotating the chuck 123 in accordance with the determined rotational parameter, to deposit a second film 222 on the second wafer 212. In one or more embodiments where the first wafer 211 was rotated during the deposition of the first film 221, the rotational movement of the second wafer 212 is different from that of the first wafer 211.

At operation 630, it is determined whether the second film exhibits symmetric thickness non-uniformity. In one or more embodiments where the second film 222 already exhibits thickness uniformity, the film deposition method 600 proceeds to the subsequent wafer and/or wafer batch without further changing in the rotational parameter of the chuck 123 and/or tuning of the film deposition process. In one or more embodiments where the second film 222 still exhibits symmetric thickness non-uniformity (e.g., symmetric thickness non-uniformity region 234 in FIG. 2B), the film deposition method 600 proceeds to operation 640.

At operation 640, the film deposition process is tuned with at least one symmetric tuning knob to compensate for the symmetric thickness non-uniformity of the second film 222. For example, as described with respect to FIG. 2C, the film deposition process is tuned with at least one symmetric tuning knob, e.g., the plasma power tuning knob 301, to compensate for the symmetric thickness non-uniformity (e.g., the symmetric thickness non-uniformity region 234) of the second film 222. The tuning is determined, in one or more embodiments, by the controller 170 in the manner described with respect to FIG. 5.

At operation 650, a third wafer is supported on the chuck, and the tuned film deposition process is performed on the third wafer while rotating the chuck in accordance with the determined rotational parameter, to deposit a third film on the third wafer. For example, as described with respect to FIGS. 2C-2D, the third wafer 213 is supported on the chuck 123, and the tuned film deposition process is performed on the third wafer 213 while rotating the chuck 123 in accordance with the determined rotational parameter, to deposit a third film 223 on the third wafer 213. The resulting third film 223 is free of both asymmetric and symmetric thickness non-uniformity. The determined rotational parameter and tuned film deposition process are used for subsequent wafers and/or wafer batches to obtain similar films with thickness uniformity. In some embodiments, one or more of the wafers have a diameter of 450 mm or larger.

In some embodiments, before performing the film deposition process on a second wafer, and based on the asymmetric thickness non-uniformity of the first film determined at operation 615 as well as on the rotational parameter determined at operation 620, it is further determined whether symmetric thickness non-uniformity would occur in a second film to be formed on the second wafer. The determination is performed, in one or more embodiments, by the controller 170 as described with respect to FIG. 5. The film deposition process is tuned to compensate for any symmetric thickness non-uniformity that would occur in the second film, in a manner similar to operation 640. A second film is deposited by performing the tuned film deposition process on the second wafer while rotating the chuck in accordance with the determined rotational parameter, in a manner similar to operation 650. The resulting second film is free of both asymmetric and symmetric thickness non-uniformity. The determined rotational parameter and tuned film deposition process are used for subsequent wafers and/or wafer batches to obtain similar films with thickness uniformity. In some embodiments, one or more of the wafers have a diameter of 450 mm or larger.

Operations may be added, replaced, changed order, and/or eliminated as appropriate, in accordance with the spirit and scope of embodiments of the disclosure. Embodiments that combine different features and/or different embodiments are within scope of the disclosure and will be apparent to those skilled in the art after reviewing this disclosure.

Figure 7:
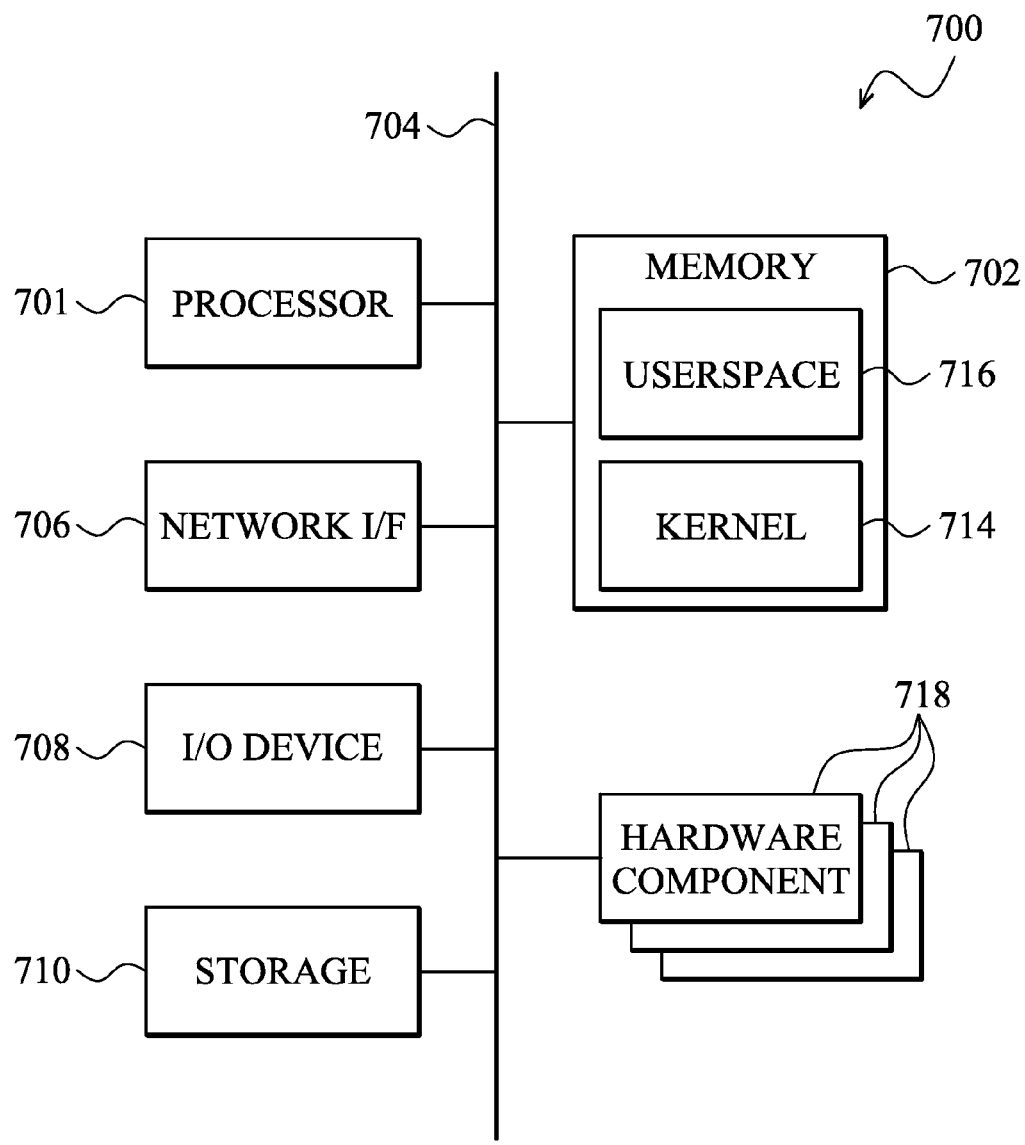
FIG. 7 is a block diagram of a computer system in accordance with some embodiments.

One or more of the controllers 114, 170 is realized in some embodiments as a computer system 700 of FIG. 7. The system 700 comprises a processor 701, a memory 702, a network interface (I/F) 706, a storage 310, an input/output (I/O) device 708, and one or more hardware components 718 communicatively coupled via a bus 704 or other interconnection communication mechanism.

The memory 702 comprises, in some embodiments, a random access memory (RAM) and/or other dynamic storage device and/or read only memory (ROM) and/or other static storage device, coupled to the bus 704 for storing data and/or instructions to be executed by the processor 701, e.g., kernel 714, userspace 716, portions of the kernel and/or the userspace, and components thereof. The memory 702 is also used, in some embodiments, for storing temporary variables or other intermediate information during execution of instructions to be executed by the processor 701.

In some embodiments, a storage device 710, such as a magnetic disk or optical disk, is coupled to the bus 704 for storing data and/or instructions, e.g., kernel 714, userspace 716, etc. The I/O device 708 comprises an input device, an output device and/or a combined input/output device for enabling user interaction with the system 700. An input device comprises, for example, a keyboard, keypad, mouse, trackball, trackpad, and/or cursor direction keys for communicating information and commands to the processor 701. An output device comprises, for example, a display, a printer, a voice synthesizer, etc. for communicating information to a user.

In some embodiments, the processes or functionality described with respect to one or more of the controllers 114, 170 are realized by a processor, e.g., the processor 701, which is programmed for performing such processes. One or more of the memory 702, the I/F 706, the storage 310, the I/O device 708, the hardware components 718, and the bus 704 is/are operable to receive instructions, data, design rules and/or other parameters for processing by the processor 701.

In some embodiments, one or more of the processes or functionality is/are performed by specifically configured hardware (e.g., by one or more application specific integrated circuits or ASIC(s)) which is/are included) separate from or in lieu of the processor. Some embodiments incorporate more than one of the described processes in a single ASIC.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

In a method according to some embodiments, a wafer is supported on a chuck in a plasma process chamber. A plasma is generated in the plasma process chamber and a plasma process is performed on the wafer using the generated plasma. The chuck and the wafer supported thereon are rotated during the plasma process to reduce thickness non-uniformity of a film on the wafer which film is processed by the plasma process.

According to some embodiments, in a film deposition method, a first wafer is supported on a chuck which is rotatable about a rotational axis. A film deposition process is performed on the first wafer to deposit a first film on the first wafer. Asymmetric thickness non-uniformity of the first film with respect to the rotational axis of the chuck is determined. A rotational parameter of the chuck is determined to compensate for the determined asymmetric thickness non-uniformity. A second wafer is supported on the chuck. The film deposition process is performed on the second wafer, while rotating the chuck in accordance with the determined rotational parameter, to deposit a second film on the second wafer.

According to some embodiments, a wafer processing system comprises a process chamber configured to perform a plasma process to process a first film on a first wafer, a rotatable chuck in the process chamber for supporting the first wafer during the plasma process, a metrology chamber configured to measure thickness of the first film in various regions, and a controller coupled to the process chamber, the chuck and the metrology chamber. The controller collects the measured thicknesses from the metrology chamber and, based on the measured thicknesses, determines asymmetric thickness non-uniformity of the first film with respect to a rotational axis of the chuck. The controller further determines a rotational parameter of the chuck to compensate for the determined asymmetric thickness non-uniformity. The controller also controls the chuck to rotate, while supporting a second wafer, in accordance with the rotational parameter during the plasma process performed on the second wafer.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A method, comprising:
   supporting a wafer on a chuck in a plasma process chamber;
   generating a plasma in the plasma process chamber and performing a plasma process on the wafer using the generated plasma;
   rotating the chuck and the wafer supported thereon during the plasma process to reduce thickness non-uniformity of a film on the wafer, the film processed by the plasma process; and
   selectively controlling a plasma power in one or more controllable zones with respect to the wafer, the controllable zones of the one or more controllable zones comprising at least a first zone having a first radius with respect to a center of the wafer, a second zone excluding the first zone and having a second radius greater than the first radius with respect to the center of the wafer, and a third zone excluding the first zone and the second zone and having a third radius greater than the second radius with respect to the center of the wafer,
   wherein the controllable zones of the one or more controllable zones each have an individually controllable plasma power.

2. The method of claim 1, wherein the plasma process is selected from the group consisting of plasma-enhanced chemical vapor deposition (PECVD), plasma-enhanced atomic layer deposition (PEALD), plasma etch, and plasma photoresist strip.

3. The method of claim 1, wherein the rotating is controlled based on asymmetric thickness non-uniformity of a film processed on a previous wafer by the plasma process, and the asymmetric thickness non-uniformity is non-symmetric with respect to a rotational axis of the chuck.

4. The method of claim 3, wherein the rotating is controlled to change the asymmetric thickness non-uniformity to symmetric thickness non-uniformity that is symmetric with respect to the rotational axis of the chuck.

5. The method of claim 1, further comprising:
   tuning the plasma process with at least one tuning knob;
   wherein
   the rotating is performed to reduce asymmetric thickness non-uniformity that is non-symmetric with respect to a rotational axis of the chuck, and
   the tuning is performed to reduce symmetric thickness non-uniformity that is symmetric with respect to the rotational axis of the chuck.

6. The method of claim 5, wherein the at least one tuning knob includes at least one control selected from the group consisting of plasma power control, wafer temperature control and gas flow control.

7. The method of claim 5, wherein the tuning is performed in accordance with symmetric thickness non-uniformity of a film processed on a previous wafer by the plasma process while the previous wafer was being rotated.

8. A film deposition method, comprising:
   supporting a first wafer on a chuck which is rotatable about a rotational axis;
   performing a film deposition process on the first wafer to deposit a first film on the first wafer;
   determining asymmetric thickness non-uniformity of the first film with respect to the rotational axis of the chuck;
   determining a rotational parameter of the chuck to compensate for the determined asymmetric thickness non-uniformity;
   supporting a second wafer on the chuck;
   performing the film deposition process on the second wafer, while rotating the chuck in accordance with the determined rotational parameter, to deposit a second film on the second wafer; and
   selectively controlling a plasma power in one or more controllable zones with respect to the first wafer or the second wafer, the controllable zones of the one or more controllable zones comprising at least a first zone having a first radius with respect to a center of the first wafer or the second wafer, a second zone excluding the first zone and having a second radius greater than the first radius with respect to the center of the first wafer or the second wafer, and a third zone excluding the first zone and the second zone and having a third radius greater than the second radius with respect to the center of the first wafer or the second wafer,
   wherein the controllable zones of the one or more controllable zones each have an individually controllable plasma power.

9. The film deposition method of claim 8, wherein the rotational parameter is determined to at least change the asymmetric thickness non-uniformity to symmetric thickness non-uniformity.

10. The film deposition method of claim 8, wherein the film deposition process is thermal deposition or plasmas-enhanced deposition.

11. The film deposition method of claim 8, wherein the film deposition process is performed on the first wafer without rotating the chuck.

12. The film deposition method of claim 8, wherein the film deposition process is performed on the first wafer while rotating the chuck with a rotational parameter different from the rotational parameter with which the chuck is rotated during the film deposition process on the second wafer.

13. The film deposition method of claim 8, further comprising:
based on the asymmetric thickness non-uniformity of the first film and the determined rotational parameter, determining, before performing the film deposition process on the second wafer, whether symmetric thickness non-uniformity would occur in the second film; and
tuning the film deposition process with at least one tuning knob to compensate for any symmetric thickness non-uniformity that would occur in the second film;
wherein the second film is deposited by performing the tuned film deposition process on the second wafer while rotating the chuck in accordance with the determined rotational parameter.

14. The film deposition method of claim 8, further comprising
determining whether the second film exhibits symmetric thickness non-uniformity;
tuning the film deposition process with at least one tuning knob to compensate for any symmetric thickness non-uniformity of the second film;
supporting a third wafer on the chuck;
performing the tuned film deposition process on the third wafer while rotating the chuck in accordance with the determined rotational parameter, to deposit a third film on the third wafer.

15. The film deposition method of claim 14, wherein the at least one tuning knob includes at least one selected from the group consisting of plasma power control, wafer temperature control and gas flow control.

16. The film deposition method of claim 8, wherein
the asymmetric thickness non-uniformity of the first film is determined by
measuring thicknesses of the first film in various regions;
identifying, among the various regions, first and second region non-symmetric with respect to the rotational axis of the chuck and having first and second thickness respectively lower and higher than a target thickness; and
the rotational parameter for rotating the chuck during the deposition of the second film on the second wafer is determined to merge the first and second asymmetric regions with different first and second thicknesses into a symmetric region having a substantially uniform thickness.

17. The film deposition method of claim 8, wherein the wafers have a diameter of 450 mm and up.

18. A film deposition method, comprising:
supporting a first wafer on a chuck which is rotatable about a rotational axis;
depositing a first film on the first wafer supported on the chuck;
determining asymmetric thickness non-uniformity of the first film with respect to the rotational axis of the chuck;
determining a rotational parameter of the chuck to compensate for the determined asymmetric thickness non-uniformity;
supporting a second wafer on the chuck;
depositing a second film on the second wafer supported on the chuck while rotating the chuck in accordance with the determined rotational parameter;
determining the second film exhibits symmetric thickness non-uniformity greater than a predetermined allowable threshold;
supporting a third wafer on the chuck;
reducing a plasma power of a film deposition process;
depositing a third film on the third wafer by way of the film deposition processing having a reduced plasma power; and
selectively controlling a plasma power in one or more controllable zones with respect to the first wafer, the second wafer, or the third wafer, the controllable zones of the one or more controllable zones comprising at least a first zone having a first radius with respect to a center of the first wafer, the second wafer or the third wafer, a second zone excluding the first zone and having a second radius greater than the first radius with respect to the center of the first wafer, the second wafer, or the third wafer, and a third zone excluding the first zone and the second zone and having a third radius greater than the second radius with respect to the center of the first wafer, the second, or the third wafer,
wherein the controllable zones of the one or more controllable zones each have an individually controllable plasma power.

19. The method of claim 18, wherein the plasma power is reduced in more than one controllable zone.

20. The method of claim 19, further comprising:
determining a thickness non-uniformity exists following reduction of the plasma power; and
adjusting a temperature of one or more controllable zones to affect the thickness of the third film.

* * * * *